United States Patent [19]
Hayama et al.

[11] Patent Number: 5,648,293

[45] Date of Patent: Jul. 15, 1997

[54] METHOD OF GROWING AN AMORPHOUS SILICON FILM

[75] Inventors: Hiroshi Hayama; Hiroyuki Uchida; Kazushige Takechi, all of Tokyo, Japan

[73] Assignee: NEC Corporation, Tokyo, Japan

[21] Appl. No.: 273,156

[22] Filed: Jul. 22, 1994

[30] Foreign Application Priority Data

| Jul. 22, 1993 | [JP] | Japan | 5-181470 |
| Jul. 26, 1993 | [JP] | Japan | 5-183788 |
| Aug. 11, 1993 | [JP] | Japan | 5-199402 |

[51] Int. Cl.$^6$ ............................................. H01L 21/02
[52] U.S. Cl. ............... 437/101; 427/578; 148/DIG. 1
[58] Field of Search ............................ 427/578, 569; 437/101, 113, 40, 41, 225, 235; 148/DIG. 1

[56] References Cited

U.S. PATENT DOCUMENTS

| 4,363,828 | 12/1982 | Brodsky et al. | 427/39 |
| 4,406,765 | 9/1983 | Higashi et al. | 204/164 |
| 4,500,563 | 2/1985 | Ellenberger et al. | 427/38 |
| 5,433,258 | 7/1995 | Barnes et al. | 156/643.1 |
| 5,437,895 | 8/1995 | Kodama et al. | 427/578 |
| 5,441,768 | 8/1995 | Law et al. | 427/255.7 |

FOREIGN PATENT DOCUMENTS

| 60-50171 | 3/1985 | Japan . |
| 5-335244 | 12/1993 | Japan . |
| 6-181221 | 6/1994 | Japan . |

OTHER PUBLICATIONS

By J. Togawa et al., "High Rate Deposition of a-Si:H film by PE-CVD System", *Japan Applied Physics Conference 1993*, 30a-ZF-4, p. 825.

By Y. Watanabe et al., "Powder-free plasma chemical vapor deposition of hydrogenated amorphous silicon with high rf power density using modulated rf discharge", *Applied Physics Letters*, Oct. 15, 1990, vol. 57, No. 16, pp. 1616–1618.

By M. Shiratani et al., "Reaction Control in Processing Plasmas by Square-Wave-Amplitude-Modulating RF Voltage", *Technology Reports of Kyushu University*, Dec. 1989, vol. 62, No. 6, pp. 678, 679 and 681.

*Primary Examiner*—R. Bruce Breneman
*Assistant Examiner*—Matthew Whipple
*Attorney, Agent, or Firm*—Young & Thompson

[57] ABSTRACT

The invention provides a novel method of depositing an amorphous silicon film wherein a high frequency discontinuous discharge is carried out to decompose a silane system gas for a chemical vapor deposition for depositing an amorphous silicon film under conditions of a cyclic frequency of 500 Hz or more and a duty ratio of 30% or less.

7 Claims, 11 Drawing Sheets

1

METHOD OF GROWING AN AMORPHOUS SILICON FILM

BACKGROUND OF THE INVENTION

The invention relates to a method of growing an amorphous silicon film and a method of fabricating a semiconductor device involving an amorphous silicon film, and more particularly to an improvement in a quality and a growth rate of an amorphous silicon film.

Amorphous silicon is useful for a thin film transistor or other switching devices as being grown to extend in a large area at a low temperature as well as possessing a high resistivity which is required to reduce an off-current. Such a thin film transistor is usable in active matrix liquid crystal display devices or in image processing devices. Recently, for semiconductor devices such as thin film transistors involving the amorphous silicon film, requirements in reduction of manufacturing cost thereof and improvement in a quality thereof are considerable. Achievement of the reduction of the manufacturing cost of the semiconductor device involving the amorphous silicon requires an improvement in a growth rate of the amorphous silicon, while permission of the device to have a high quality and high reliability requires an improvement in a quality of the amorphous silicon. To comply with the above both requirements, it is required to develop a method of growing the amorphous silicon with an excellent quality even if the amorphous silicon is grown at a high growth rate.

It has generally been known in the art that the amorphous silicon film may be grown by use of a plasma chemical vapor deposition method in which a continuous high frequency discharge or successive radio frequency discharge is carried out for decomposition of silane system gases. Waveform of the discharge is as illustrated in FIG. 1. This continuous high frequency discharge plasma chemical vapor deposition method may cause no deposition of part of a hydrogenated amorphous silicon on a substrate and a deposition of cluster hydrogenated amorphous silicon thereon under a condition of a high deposition rate of the hydrogenated amorphous silicon. Such non-deposited or cluster hydrogenated amorphous silicon may form powder particles which cause a remarkable deterioration in the quality of the deposited hydrogenated amorphous silicon film.

The above problem with the conventional chemical vapor deposition method by use of the continuous high frequency discharge is as follows. Increase of the power density of the high frequency discharge not only results in an improvement in a high deposition rate of the hydrogenated amorphous silicon on the substrate for reduction of the manufacturing cost but also leads to a generation of powder particles formed of the non-deposited or cluster hydrogenated amorphous silicon.

To settle the above problems, it was proposed to use a discontinuous high frequency discharge in the chemical vapor deposition for a high speed deposition of the hydrogenated amorphous silicon on the substrate to obtain a powder particle free amorphous silicon film. One of the conventional discontinuous high frequency discharge deposition methods for the hydrogenated amorphous silicon is disclosed in Technology Reports of Kyushu University, Vol. 62, No. 6, December 1989 "Reaction Control in Processing Plasma by Square-Wave-Amplitude-Modulating RF Voltage". This publication reported that it has been shown experimentally that voltage-modulation in radio frequency discharging $SiH_4$ gas bring about drastic suppression of power generation all over the discharge space and also about enhancement of an electron density and a deposition rate of hydrogenated amorphous silicon in a specific range of discharge frequency. In order to clarify such phenomena, reaction processes are studied in a $He+SiH_4$ plasma produced by a square-wave amplitude modulation radio frequency discharge. This results in that the enhancement of electron density is due to a dissociative recombination process of molecular ions such as $SiH_n$ (n=1 to 3), the suppression of powder generation is due to slow formation and fast extinction processes of the powder, and ratios between $SiH_3$ and $SiH_n$ (n=0 to 2) densities become fairly large in the radio frequency power-off period.

Whereas the publication merely recites the basic mechanisms of the high rate deposition of the hydrogenated amorphous silicon by use of the discontinuous high frequency discharge deposition method, the publication neither recites nor suggests concretely experimental results as to the deposition rate and the quality of the resultant amorphous silicon film.

Another one of the conventional discontinuous high frequency discharge deposition methods for the hydrogenated amorphous silicon was reported by J. Togawa et al. in Japan Applied Physics Conference 1993 as entitled "High Rate Deposition of Hydrogenated Amorphous Silicon Film by PE-CVD System" which discloses that a high rate deposition of the hydrogenated amorphous silicon is carried out by use of the square wave amplitude modulated radio frequency discharge to suppress a generation of powder. This recites a relationship of the deposition rate versus duty ratio of the high frequency discharge. The powder generations are reduced by the high frequency modulated discharge.

Although the publication merely recites the basic mechanisms of the high rate deposition of the hydrogenated amorphous silicon by use of the discontinuous high frequency discharge deposition method, the publication neither recites nor suggests concretely experimental results as to the deposition rate and the quality of the resultant amorphous silicon film.

Further, the Japanese laid-open patent application No. 60-50171 describes a chemical vapor deposition system in which discontinuous high frequency plasma discharge is carried out to decompose source gasses such as silane for the high rate deposition of the hydrogenated amorphous silicon.

While the publication merely recites the basic mechanisms of the high rate deposition of the hydrogenated amorphous silicon by use of the discontinuous high frequency discharge deposition method, the publication neither recites nor suggests concretely experimental results as to the deposition rate and the quality of the resultant amorphous silicon film.

Moreover, it is disclosed in the Japanese Laid-open Patent Application No. 58-157600 to utilize the discontinuous high frequency plasma discharge for decomposition of the source gases such as silane to achieve a high rate deposition of the hydrogenated amorphous silicon on the substrate. The discharge operation is controllable by gate pulse operation. When the gate pulse is in ON state, the high frequency plasma discharge is carried out to decompose the source gas for a high rate deposition of the hydrogenated amorphous silicon on the substrate. When the gate pulse is in the OFF state, the plasma discharge is discontinued. Time period and duty ratio of the discontinuous high frequency plasma discharge are constant as illustrated in FIG. 2.

While the publication merely recites the suppression of the powder generation on the basis of the basic mechanisms of the high rate deposition of the hydrogenated amorphous silicon by use of the discontinuous high frequency discharge deposition method, the publication neither recites nor suggests concretely experimental results as to the deposition rate and the quality of the resultant amorphous silicon film.

Furthermore, it is disclosed in Applied Physics Letters, Vol. 57, No. 16, October, 1990, pp. 1616–1618 to utilize a discontinuous radio frequency modulated plasma discharge for high speed chemical vapor deposition of the hydrogenated amorphous silicon on the substrate. A high deposition rate of 360 angstroms per minute for hydrogenated amorphous silicon deposition on the substrate under the conditions of a low concentration of 5% $SiH_4$ and a high radio frequency peak power of 200 W results in an absence of any appreciable amount of powder particles in a reaction chamber.

In view of the mass production of the semiconductor devices involving the amorphous silicon film, further improvement in the deposition rate of the hydrogenated amorphous silicon free from any powder particle has been required for improvement in the throughput of the plasma chemical vapor deposition system to curtail the manufacturing cost of the semiconductor device. In the above viewpoint, for the plasma chemical vapor deposition, higher deposition a rate of at least 400 angstroms per minute free from any generation of powder particle is required.

Still further, the amorphous silicon is useful in the thin film transistor as described above. It is very important to improve a deposition rate for deposition of a high quality amorphous silicon film free from any powder particle to curtail the manufacturing cost of the thin film transistor involving the amorphous silicon film. One of the conventional thin film transistors involving the amorphous silicon film is disclosed in the Japanese laid-open patent application No. 64-71173 in which the thin film transistor has a high electron mobility property. A structure of the thin film transistor is illustrated in FIG. 3. The thin film transistor has an insulative substrate 11 on which a gate electrode 12 is formed. A gate insulating film 13 is formed on the gate electrode and the insulating substrate 11. A high electron mobility amorphous silicon film 61a having a thickness of 20 nanometers is deposited at a low deposition rate on the gate insulating film 13 by a high frequency discharge at a low power. A low electron mobility amorphous silicon film 61b having a thickness of 300 nanometers is deposited at a high deposition rate on the high electron mobility amorphous silicon film 61a by a high frequency discharge at a high power. The low electron mobility amorphous silicon film 61b has a recessed portion surrounded projecting top portions. A doped layer 15 is formed on the top portions of the low electron mobility amorphous silicon film 61b. Source and drain electrode 16 and 17 are provided on the doped layer 15. The deposition of the high electron mobility amorphous silicon film 61a is carried out at a deposition rate of 5 nanometers per minute for four minutes, while the deposition of the low electron mobility amorphous silicon film 61b is carried out at a deposition rate of 30 nanometers per minute for ten minutes. The deposition rate of 30 nanometers per minute for deposition of the low electron mobility amorphous silicon film is almost the maximum deposition rate to suppress any generation of powder particles for high quality of the amorphous silicon film.

To facilitate the reduction of the manufacturing cost, it is important to shorten the time necessary for deposition of the amorphous silicon film involved in the thin film transistors. This requires increasing the deposition rate of the amorphous silicon films involved in the thin film transistors, while it is necessary for securing a high quality of the thin film transistor to suppress any generation of powder particles in deposition of the amorphous silicon films. As described above, the generation of the powder particles in the amorphous silicon deteriorates the quality of the amorphous silicon film. This results in a low yield in manufacturing the thin film transistor.

In the viewpoints as described above, it would therefore be required to develop a novel method for further increase of a deposition rate in a high frequency plasma discharge chemical vapor deposition of a powder particle free amorphous silicon film for considerable reduction of a manufacturing cost of semiconductor devices involving the amorphous silicon film as well as a high quality thereof.

SUMMARY OF THE INVENTION

Accordingly, it is a primary object of the present invention to provide a novel method of deposition of hydrogenated amorphous silicon.

It is a further object of the present invention to provide a novel method of a chemical vapor deposition at a high deposition rate of a powder particle free amorphous silicon film by using a high frequency plasma discharge.

It is a furthermore object of the present invention to provide an improvement in a deposition rate of a high frequency plasma discharge chemical vapor deposition of a powder particle free amorphous silicon film.

It is a still further object of the present invention to provide a method of forming a semiconductor device involving a powder particle free amorphous silicon film which is deposited at a high deposition rate by use of a high frequency plasma discharge chemical vapor deposition.

It is yet a further object of the present invention to provide a method of forming a thin film transistor involving a powder particle free amorphous silicon film which is deposited at a high deposition rate by use of a high frequency plasma discharge chemical vapor deposition.

It is a moreover object of the present invention to reduce a manufacturing cost for forming a semiconductor device involving a high quality amorphous silicon film which is deposited at a high deposition rate by use of a high frequency plasma discharge chemical vapor deposition.

The above and other objects, features, and advantages of the present invention will be apparent from the following descriptions.

The invention provides a novel method of depositing an amorphous silicon film wherein a high frequency discontinuous discharge is carried out to decompose a silane system gas for a chemical vapor deposition for depositing an amorphous silicon film under conditions of a cyclic frequency of 500 Hz or more and a duty ratio of 30% or less.

The invention provides a novel method of forming a semiconductor device involving an amorphous silicon film wherein a high frequency discontinuous discharge is carried out to decompose a silane system gas for a chemical vapor deposition for depositing an amorphous silicon film under conditions of a cyclic frequency of 500 Hz or more and a duty ratio of 30% or less.

In the above present invention, silane, disilane and trisilane are available as a silane system gas.

The invention provides a novel method of depositing an amorphous silicon film wherein a high frequency discontinuous discharge process comprising alternate high duty ratio periods and low duty ratio periods is carried out to decompose a silane system gas for a chemical vapor deposition for depositing an amorphous silicon film. The duty ratios are discontinuously varied from one to another state. The duty ratios are continuously and linearly varied from one to another state. The low duty ratio includes zero duty ratio.

The invention provides a novel method of fabricating a semiconductor thin film transistor involving top and bottom amorphous silicon films wherein said bottom amorphous silicon film is deposited by use of a continuous high frequency discharge decomposing a silane system gas and said top amorphous silicon film is deposited by use of a discontinuous high frequency discharge decomposing a silane system gas.

The invention provides a novel method of fabricating a semiconductor thin film transistor involving top and bottom amorphous silicon films wherein said bottom amorphous silicon film is deposited by use of a first discontinuous high frequency discharge for decomposing a silane system gas at a low duty ratio and said top amorphous silicon film is deposited by use of a discontinuous high frequency discharge for decomposing a silane system gas at a high duty ratio. The low duty ratio may be either discontinuously or continuously increased to the high duty ratio.

The invention provides a novel method of fabricating a semiconductor thin film transistor involving top and bottom amorphous silicon films wherein said bottom amorphous silicon film is deposited by use of a first discontinuous high frequency discharge for decomposing a silane system gas at a low discharge power and said top amorphous silicon film is deposited by use of a discontinuous high frequency discharge for decomposing a silane system gas at a high discharge power. The low discharge power may be either discontinuously or continuously increased to the high discharge power.

BRIEF DESCRIPTION OF THE DRAWINGS

Preferred embodiments of the present invention will hereinafter be described in detail with reference to the accompanying drawings.

FIGS. 14A to 15E are fragmentary cross sectional elevation views illustrative of thin film transistors in sequential fabrication steps involved in novel fabrication methods in third and fourth embodiments according to the present invention.

FIGS. 15A to 15E are fragmentary cross sectional elevation views illustrative of thin film transistors in sequential fabrication steps involved in a novel fabrication method in a fifth embodiment according to the present invention.

DESCRIPTION OF THE INVENTION

The invention provides a novel method of a chemical vapor deposition for depositing a powder particle free amorphous silicon at a high deposition rate by use of a discontinuous high frequency plasma discharge. The high frequency plasma discharge is carried out to decompose silane system gases in which on/off switching operation of a high frequency power source for the plasma discharge is performed at a frequency of 500 Hz or more where the high frequency power source has an on-state for a 30% or less on-state period in the on-off switching operation time period. Silane, disilane and trisilane are available as the silane system gases.

The invention also provides a novel method of a thin film transistor involving a high quality amorphous silicon film free from powder particles. The amorphous silicon film is deposited by a chemical vapor deposition at a high deposition rate by use of a discontinuous high frequency plasma discharge. The high frequency plasma discharge is carried out to decompose silane system gases in which on/off switching operation of a high frequency power source for the plasma discharge is performed at a frequency of 500 Hz or more where the high frequency power source has an on-state for a 30% or less on-state period in the on-off switching operation time period. Silane, disilane and trisilane are also available as the silane system gasses. The amorphous silicon film is useful as a channel layer, or source and drain layers involved in the thin film transistor.

The above described novel high speed deposition method for the powder particle free amorphous silicon film utilizes a discontinuous plasma discharge to decompose the silane system gases at the condition of 30% or less on-state period in the on-off switching operation time period. To evaluate the quality of the deposited amorphous silicon, an electron mobility of the amorphous silicon film is measured. For that purpose, a channel etch inverse staggered hydrogenated amorphous silicon thin film transistor and a channel protection inverse staggered hydrogenated amorphous silicon thin film transistor are fabricated for subsequent measurement of the electron mobility of the hydrogenated amorphous silicon. The measurement of the electron mobility of the deposited hydrogenated amorphous silicon could appreciate an amount of generation of powder particles in the deposition process. The electron mobility of the above thin film transistors shows the same dependency upon the conditions for the deposition of the hydrogenated amorphous silicon film. A high electron mobility of the hydrogenated amorphous silicon film means that the deposited hydrogenated amorphous silicon has a small amount of powder powder particles generated in the deposition process.

Figure 1:
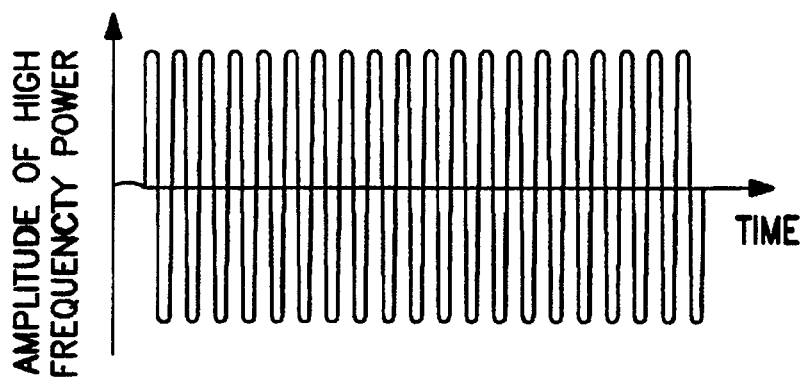
FIG. 1 is a diagram illustrative of a wave form of a continuous high frequency discharge power in a chemical vapor deposition process for depositing a hydrogenated amorphous silicon film.
Figure 2A:
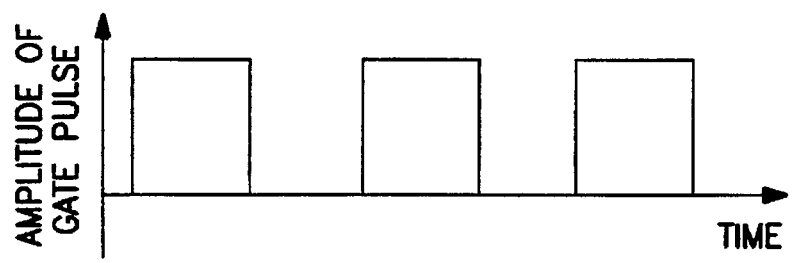
FIG. 2A is a diagram illustrative of a wave form of a gate pulse in a discontinuous high frequency discharge.
Figure 2B:
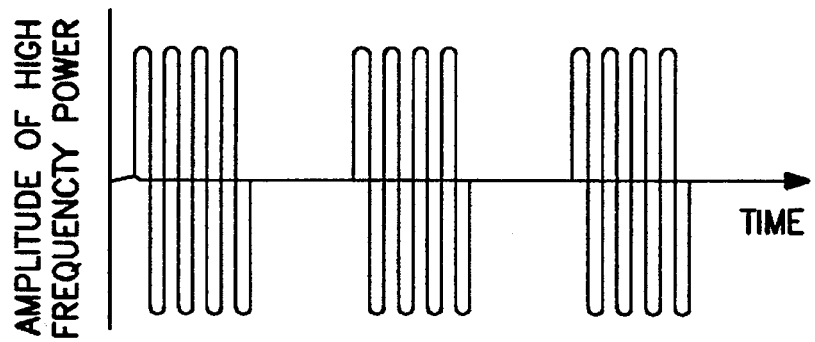
FIG. 2B is a diagram illustrative of a wave form of a discontinuous discharge power controlled by the gate pulse that wave form is illustrated in FIG. 2A.
Figure 3:
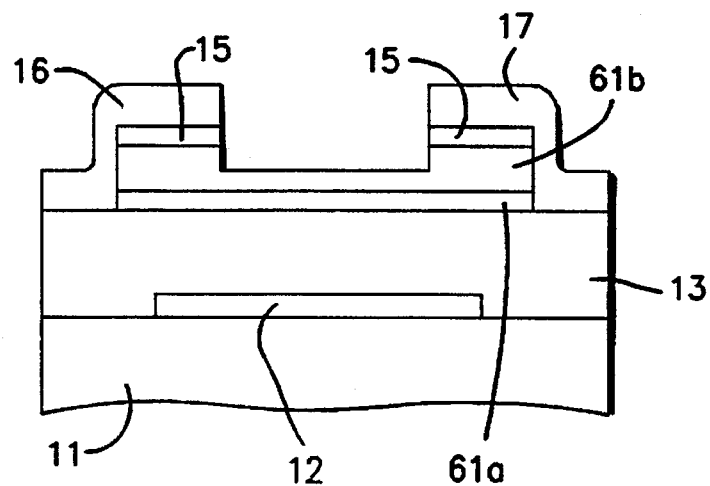
FIG. 3 is a fragmentary cross sectional elevation view illustrative of a thin film transistor involving amorphous silicon films deposited by chemical vapor depositions.
Figure 4:
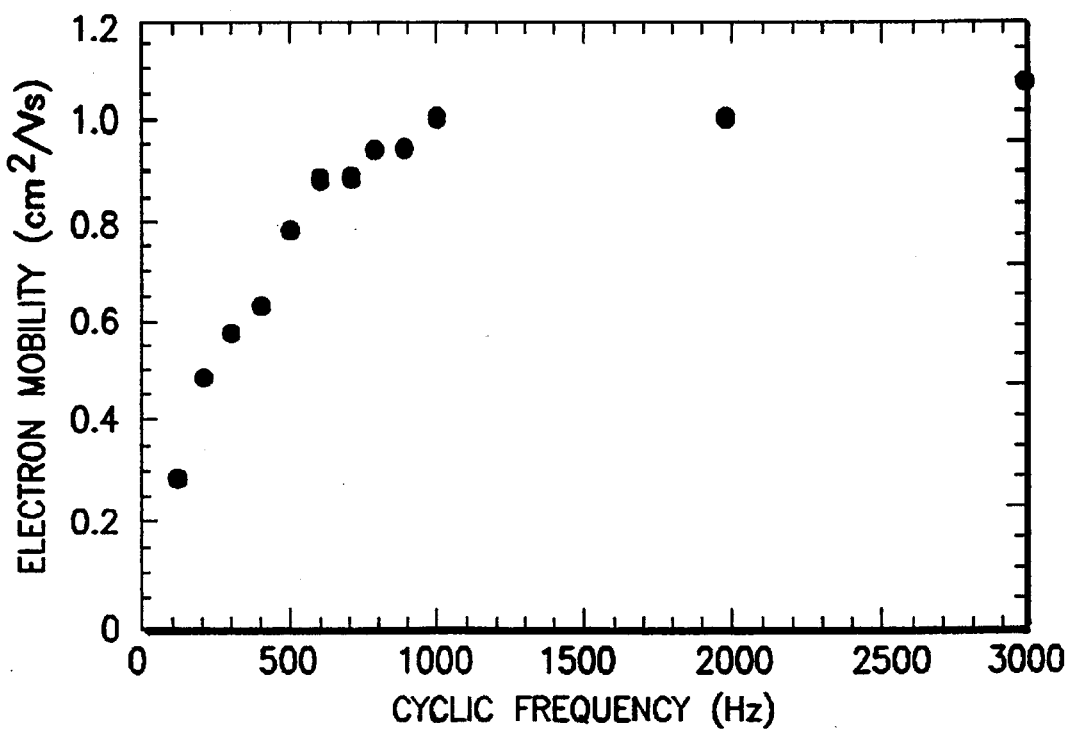
FIG. 4 is a diagram illustrative of an electron mobility versus a cyclic frequency in a high frequency discharge involved in a plasma discharge chemical vapor deposition for amorphous silicon.

FIG. 4 illustrates a relationship of the electron mobility of the amorphous silicon film involved in the fabricated thin film transistor versus the frequency of the on/off switching operation of power source for the discontinuous discharge. The deposition of the hydrogenated amorphous silicon was carried out under the conditions as described below. A substrate temperature is in the range of from 300° C. to 350° C. Flow rates of silane and hydrogen are 200 sccm and 800 sccm respectively. A gas pressure in the discharge is in the range of from 200 Pa to 300 Pa. A ratio of the on-state time period of the discharge versus the cyclic time period of the on-off switching operations of the power source for the discontinuous discharge is 20%. An applied power density in the discharge is 0.12 W/cm$^2$.

From FIG. 4, it could be appreciated that the electron mobility is small, as the cycle frequency of the on-off switching operations of the power source for the discontinuous discharge is low. As the cycle frequency of the on-off switching operations of the power source for the discontinuous discharge is over approximately 500 Hz, the measured electron mobility is not less than 0.8 cm$^2$/vs.

Figure 5:
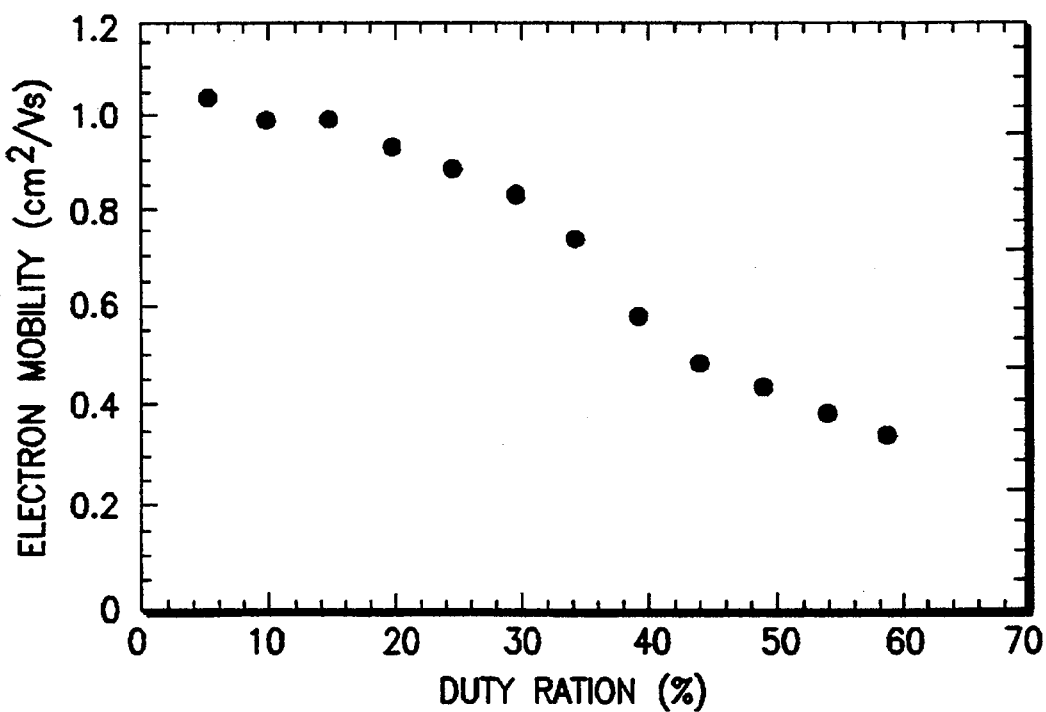
FIG. 5 is a diagram illustrative of an electron mobility versus a duty ratio in a high frequency discharge involved in a plasma discharge chemical vapor deposition for amorphous silicon.

FIG. 5 also illustrates a relationship of the electron mobility of the amorphous silicon film involved in the fabricated thin film transistor versus a ratio of the on-state period of the high frequency discharge to the cyclic time period of the on/off switching operation of the power source for discontinuous discharge. For convenience, the ratio of the on-state time period of the high frequency discharge versus the cyclic time period of the on/off switching operation of the power source will be referred to as a duty ratio. Namely, the duty ratio indicates a degree of the on-state time period involved in the cyclic time period of the on-off switching operation of the power source for the discontinuous discharge to decompose the silane system gases for the deposition of the hydrogenated amorphous silicon. The deposition of the hydrogenated amorphous silicon was carried out under the conditions as described below. A substrate temperature is in the range of from 300° C. to 350° C. Flow rates of silane and hydrogen are 200 sccm and 800 sccm respectively. A gas pressure in the discharge is in the range of from 200 Pa to 300 Pa. The cyclic time period of the discontinuous discharge is 100 Hz. An applied power density in the discharge is 0.12 W/cm$^2$.

From FIG. 5, it could be appreciated that the electron mobility is small, as the duty ratio or the ratio of the on-state time period of the high frequency discharge versus the cyclic time period of the on/off switching operation of the power source is high. As the duty ratio is not more than approximately 30%, the measured electron mobility is not less than 0.8 cm$^2$/vs.

From the results as described and illustrated in FIGS. 4 and 5, it was confirmed that the high frequency plasma discharge to decompose the silane system gases is carried out to obtain the thin film transistor having the electron mobility of over approximately 0.8 cm$^2$/vs, provided that the on/off switching operation of a high frequency power source for the plasma discharge was performed at the cyclic frequency not less than 500 Hz where the duty ratio or the ratio of the ratio of the on-state time period of the high frequency discharge versus the cyclic time period of the on/off switching operation of the power source is not more than 30%.

It was further confirmed that when the duty ratio is much less than 305, substantially the same high electron mobility is obtainable even if the cyclic frequency for the discontinuous discharge operation is 30%. Under such conditions as a low duty ratio and a low cyclic frequency, the deposition rate of the hydrogenated amorphous silicon is lowered. It seems that such the conditions as the low duty ratio and the low cyclic frequency are unsuitable for mass productions of the thin film transistor arrays.

A comparison in the amount of the generated powder particle in the deposited hydrogenated amorphous silicon film was made between the novel discontinuous chemical vapor deposition method under the above conditions according to the present invention and the continuous chemical vapor deposition wherein the source gases, the flow rate of the source gases and the gas pressure are the same between the both depositions. It was confirmed that the amount of the generation of the powder particles in the hydrogenated amorphous silicon film deposited by the novel chemical vapor deposition method under the conditions as described according to the present invention is considerably reduced by $\frac{1}{10}$ to $\frac{1}{1000}$ times from the amount of the powder particle in the hydrogenated amorphous silicon film deposited by use of the conventional continuous discharge deposition method. The novel method of the discontinuous discharge deposition under the conditions of the cycle frequency of 500 Hz and the duty ratio of not more than 30% provides the considerable reduction by one to three orders of magnitude in the amount of the generation of more than 0.3 micrometers dusts or powder particles in the hydrogenated amorphous silicon.

Alternatively, the present invention also provides another novel method for a chemical vapor deposition for depositing a powder particle free amorphous silicon at a high deposition rate by use of a discontinuous high frequency plasma discharge. The discontinuous high frequency plasma discharge is carried out to decompose silane system gases in which the on/off switching operation of a high frequency power source for the plasma discharge comprises alternate high duty ratio discharge periods and low duty ratio discharge periods. Alternatively, the on/off switching operation of a high frequency power source for the plasma discharge any comprise alternate high duty ratio discharge periods and zero duty ratio discharge periods.

Figure 10:
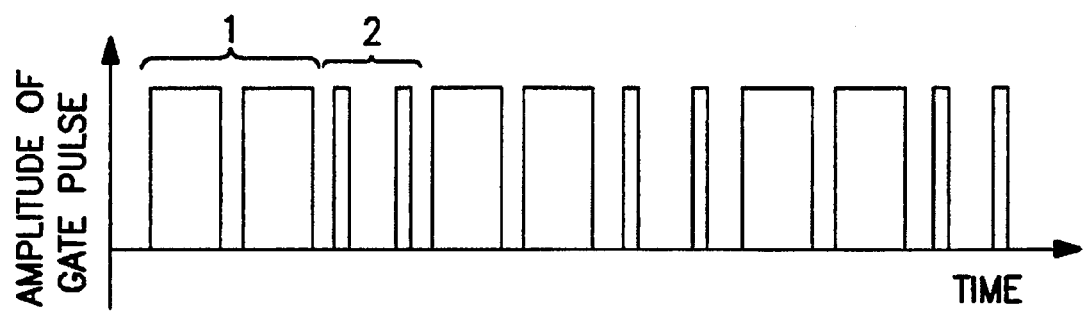
FIG. 10 is a diagram illustrative of a wave form of a gate pulse in a discontinuous high frequency discharge.
Figure 11:
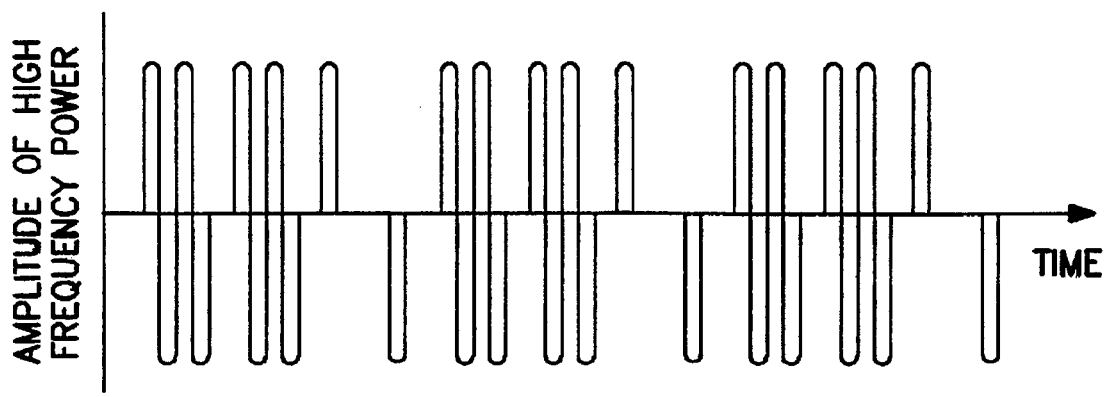
FIG. 11 is a diagram illustrative of a wave form of a discontinuous discharge power controlled by the gate pulse that wave form is illustrated in FIG. 10.

In the plasma chemical vapor deposition processes for the hydrogenated amorphous silicon, the fear of the generation of the powder particles is a rapid generation of polymerization reaction of silicon system activators in a gas phase. The generated powder particles adheres to a sample. It is possible that the powder particle which has once come off an inner wall of a growth chamber tend to be adhered on the sample. The above high frequency plasma discharge at a low duty ratio or at the zero duty ratio permits an extinction of the activators which cause the polymerization reaction with each other. The extinction of the activators before the polymerization reaction permits suppression of the generation of the powder particles. The low duty ratio high frequency plasma discharge for decomposing the silane system gases for deposition of the hydrogenated amorphous silicon has to be continued for such a sufficient time period as to permit the extinction of the activators tending to cause the polymerization reactions with each other. Of course, the zero duty ratio high frequency plasma discharge also has to be continued for such a sufficient time period as to permit the extinction of the activators. According to this invention, the insertion of either the low or zero duty ratio plasma discharge between the high duty ratio plasma discharge is able to play an important role to suppress any generation of the powder particles, while the high duty ratio plasma discharge is able to play an important role to increase a deposition rate for the hydrogenated amorphous silicon. In this case, a wave form of the gate pulse is illustrated in FIG. 10, while a wave form of the high frequency power is illustrated in FIG. 11.

Needless to say, this alternative invention is without doubt applicable to the formation of various semiconductor devices such as the thin film transistor involving the amorphous silicon film.

Alternatively, the present invention also provides still another novel method for fabricating a thin film field effect transistor involving a double layer structure comprising top and bottom amorphous silicon films deposited by a chemical vapor deposition at a high deposition rate by use of discontinuous high frequency plasma discharge processes. The thin film field effect transistor has an insulating substrate on which a gate electrode is provided. A gate insulating film is formed on the gate electrode and on the substrate. The double layer structure of the top and bottom amorphous silicon films are deposited on the gate insulating film. The bottom amorphous silicon film is deposited on the gate insulating film by use of a continuous high frequency discharge to decompose the source gases, while the top amorphous silicon film is deposited on the bottom amorphous silicon film by use of a discontinuous high frequency discharge to decompose the source gases. Alternatively, the bottom amorphous silicon film is deposited on the gate insulating film by use of a discontinuous high frequency discharge to decompose the source gases wherein the discharge on-state time period is shorter than the off-state time period, while the top amorphous silicon film is deposited on the bottom amorphous silicon film by use of a discontinuous high frequency discharge to decompose the source gases wherein a ratio of the discharge on-state time period versus the discharge off-state time period is continuously or discontinuously increased during the deposition process. Alternatively, the bottom amorphous silicon film is deposited on the gate insulating film by use of a discontinuous high frequency discharge at a low power to decompose the source gases, while the top amorphous silicon film is deposited on the bottom amorphous silicon film by use of a discontinuous high frequency discharge at a high power to decompose the source gases wherein a ratio of the discharge on-state time period versus the discharge off-state time period is continuously or discontinuously increased during the deposition process.

Figure 6:
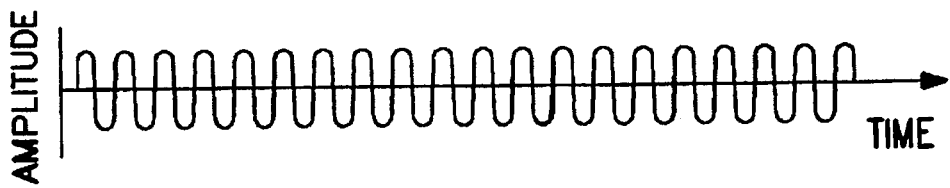
FIG. 6 is a diagram illustrative of a waveform of a continuous discharge power for plasma discharge chemical vapor deposition for depositing a hydrogenated amorphous silicon.
Figure 7:
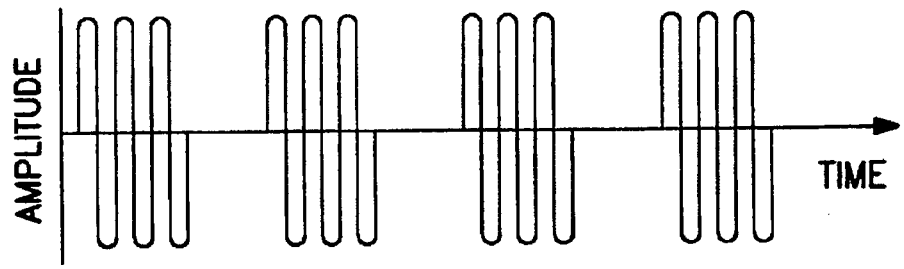
FIG. 7 is a diagram illustrative of a wave form of a discontinuous discharge power for plasma discharge chemical vapor deposition for depositing a hydrogenated amorphous silicon.
Figure 8:
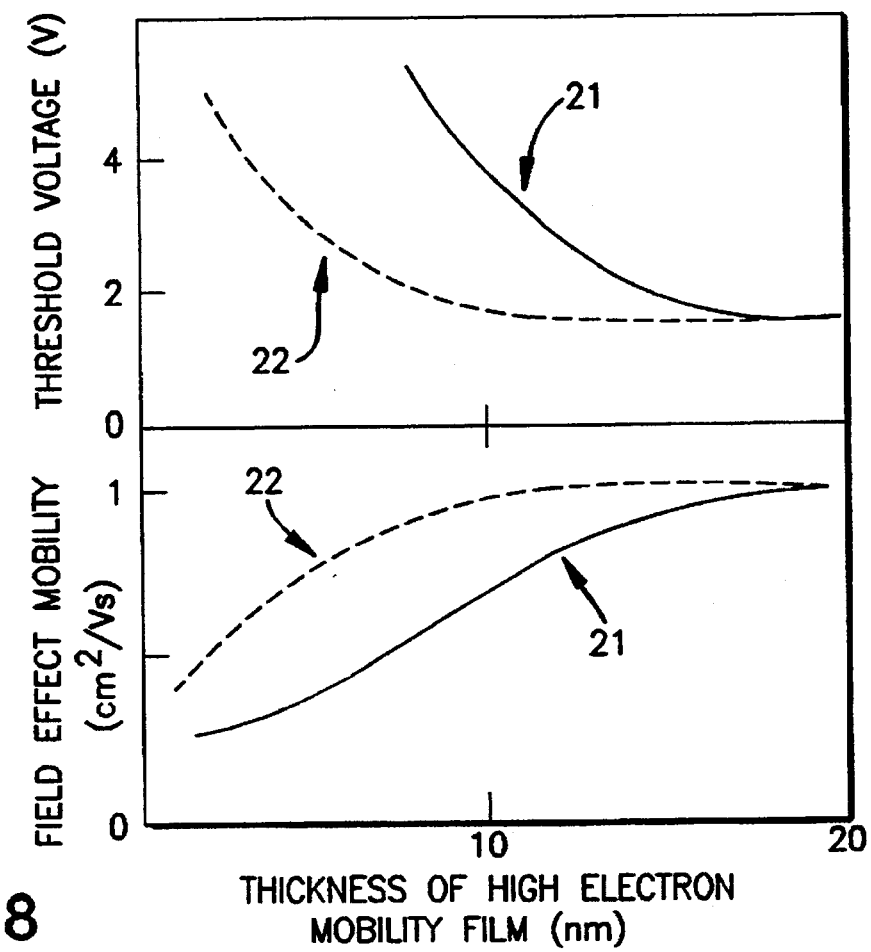
FIG. 8 is a diagram illustrative of an electron mobility and a threshold voltage versus a thickness of a high electron mobility amorphous silicon film.

As described above, the bottom amorphous silicon film may be deposited on the gate insulating film by use of a continuous high frequency discharge whose wave form may be as illustrated in FIG. 6 wherein the discharge power is small. The continuous discharge process is continued until the bottom amorphous silicon film has a thickness of several ten nanometers. The top amorphous silicon film is subsequently deposited on the bottom amorphous silicon film by use of a discontinuous high frequency discharge whose wave forms may be illustrated in FIG. 7. The deposition rate is 60 nanometers so that the powder particle free amorphous silicon having a thickness of 30 nanometers is deposited. FIG. 8 illustrates field effect electron mobility and threshold voltage serves thickness of high electron mobility amorphous silicon film deposited on the gate electrode. When the film thickness is less than approximately 15 nanometers, both decrease of the electron mobility and increase of the threshold voltage appear. In contrast, when the film thickness is over approximately 15 nanometers, the electron mobility is 1 $cm^2/Vs$ and the threshold voltage is 1.6 V. In case of the continuous discharge 22 shown in FIG. 8, a variation of the property appears when the thickness of the high electron mobility amorphous silicon film is not more than 10 nanometers. This indicates that when the discontinuous plasma discharge chemical vapor deposition is used, a larger thickness than 15 nanometers of the high electron mobility amorphous silicon film permits the thin film transistor to ensure excellent properties.

Figure 9:
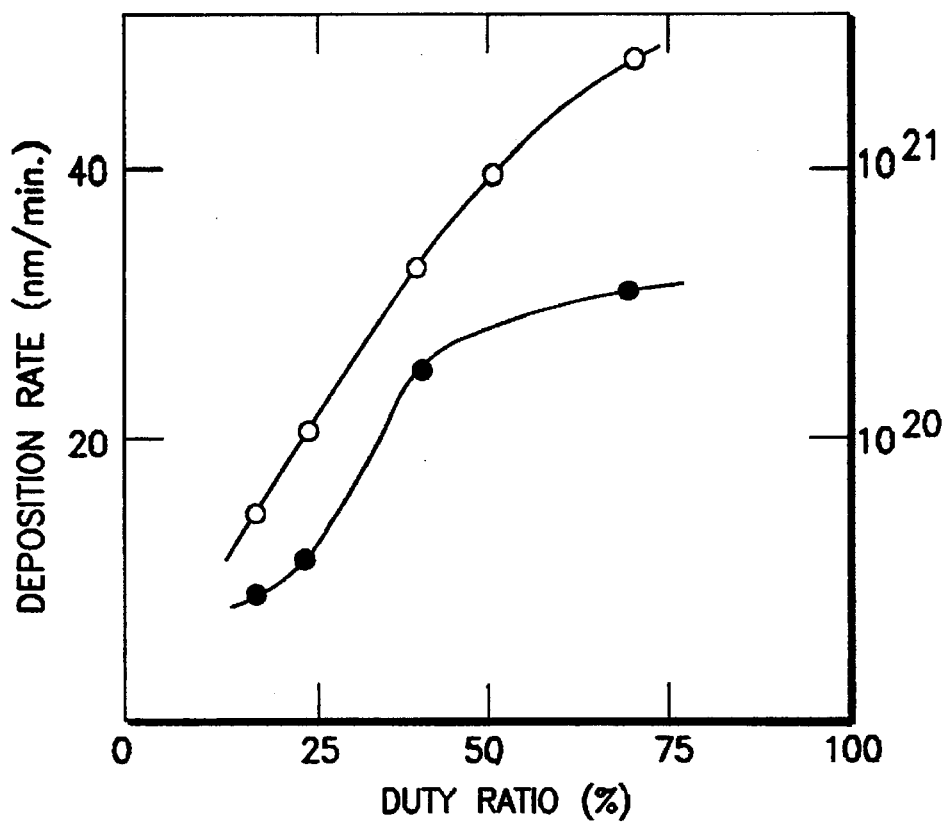
FIG. 9 is a diagram illustrative of a deposition rate and the density of Si—$H_2$ bonding versus a duty ratio.

As described above, the bottom amorphous silicon film may be deposited on the gate insulating film by use of a discontinuous high frequency discharge to decompose the source gases wherein the discharge on-state time period is shorter than the off-state time period, while the top amorphous silicon film is deposited on the bottom amorphous silicon film by use of a discontinuous high frequency discharge to decompose the source gases wherein a ratio of the discharge on-state time period versus the discharge off-state time period is continuously or discontinuously increased during the deposition process. The variation of the discharge on-state time period and the off-state time period may provide influence on the deposition rate and the quality of the deposited amorphous silicon film. As defined above, the ratio of the discharge on-state time period versus the sum of the discharge on-state time period and the discharge off-state time period corresponds to the duty ratio. FIG. 9 illustrates relationships of both the deposition rate and the number of Si—$H_2$ bonds versus the duty ratio in which the number of the bonds of hydrogen molecules to the silicon atoms is calculated from the deposition rate and the measurement of infrared light absorption. A smaller number of the Si—$H_2$ bonds indicates a good quality of the deposited amorphous silicon film. The deposition rate is proportional to the duty ratio. Namely, when the duty ratio is high, the deposition rate is also high. For example, when the duty ratio is 70%, the deposition rate is 47 nm/min. The deposition rate may further be increased by increasing the high frequency discharge power in the on-state. When the duty ratio is not more than 25%, the Si—$H_2$ bonding number is approximately $10^{20}$ cm$^{-1}$ which indicates the good quality of the film. Increase of the duty ratio causes a rapid increase of the number of the Si—$H_2$ bonding which results in a deterioration of the quality of the film. Namely, the low duty ratio leads to the small deposition rate and the good quality of the film, while the high duty ratio results in the large deposition rate and the poor quality of the film.

According to the present invention, the discontinuous plasma discharge chemical vapor deposition method is carried out at a low duty ratio to deposit the amorphous silicon film having a thickness of several ten nanometers on the gate insulating film. Thereafter, the discontinuous plasma discharge chemical vapor deposition method is carried out at a high duty ratio to deposit the amorphous silicon film having a required thickness for ensuring the high quality and reduction of the time for the deposition processes wherein the duty ratio is taken as a parameter. This may provide advantages as follows. While the duty ratio is lowered for obtain a high quality of the amorphous silicon, the discharge power has no variation thereby resulting in a stability of the discharge. Variation of the duty ratio only may permit a selection of the high quality film and the high deposition rate. A combination of the low and high duty ratio discharge processes permits for discontinuous deposition processes for reducing the deposition time. The gradual variation of the duty ratio continuously or discontinuously may suppress a generation of crystal defect at an interface between different amorphous silicon films in which the crystal defect results in a decrease of the electron mobility and an increase of the threshold voltage. This ensures excellent performance of the thin film transistors. The gradual variation of the duty ratio may be carried out by varying the duty ratio of gate pulses for controlling oscillation of the high frequency power of pulse generation circuits in which the variation of the duty ratio of the gate pulse is programmed. At the low duty ratio, the high quality thin amorphous silicon film is deposited for subsequent gradual increased of the duty ratio to suppress any generation of crystal defect. From example, at the duty ratio of 10%, the amorphous silicon film with 5 nanometers thickness is deposited for one minute for subsequent gradually and linearly increase up to 60% for one minute. This deposition processes may provide the thin film transistor having the same property as that of a thin film transistor in which at the duty ratio of 10%, the 15 nanometers thickness film is deposited for three minutes for subsequent high deposition rate at the duty ratio of 60%.

The discontinuous plasma discharge chemical vapor deposition according to the present invention has further advantages as described below. The low power high frequency discharge deposition has a stability in discharge and a good ability to control the discharge, and further may provide a uniform thickness of deposited films. For those reasons, the low power high frequency discontinuous discharge process is suitable for deposition of the high electron mobility film. The low power high frequency discontinuous plasma discharge process has wide ranges of acceptable conditions in a degree of vacuum and a gas flow rate for depositions of the film. This permits a variation of the high frequency discharge power without any discontinuation of the discharge process thereby resulting in a reduction of the necessary deposition time.

Although there is a difference in crystal structure between the low speed deposition film and the high speed deposition film, discontinuous and gradual increase of the high frequency discharge power may reduce the difference in the crystal structure between the high and low speed deposition films thereby resulting in a suppression of the generation of the crystal defects. Alternatively, continuous and gradual increase of the high frequency discharge power may reduce the difference in the crystal structure between the high and low speed deposition films thereby resulting in a suppression of the generation of the crystal defects. This permits a reduction of the thickness of the high electron mobility amorphous silicon film deposited at the low deposition rate.

A first embodiment according to the present invention will be described in detail in which a chemical vapor deposition system for depositing an amorphous silicon film has a high frequency power source with a pulse mode for on-off switching operation of a high frequency power by use of gate pulse. The system also has a matching box with a high speed matching circuit for response time within 100 micrometers. High frequency electrode has a size of 600 millimeters.

Figure 12:
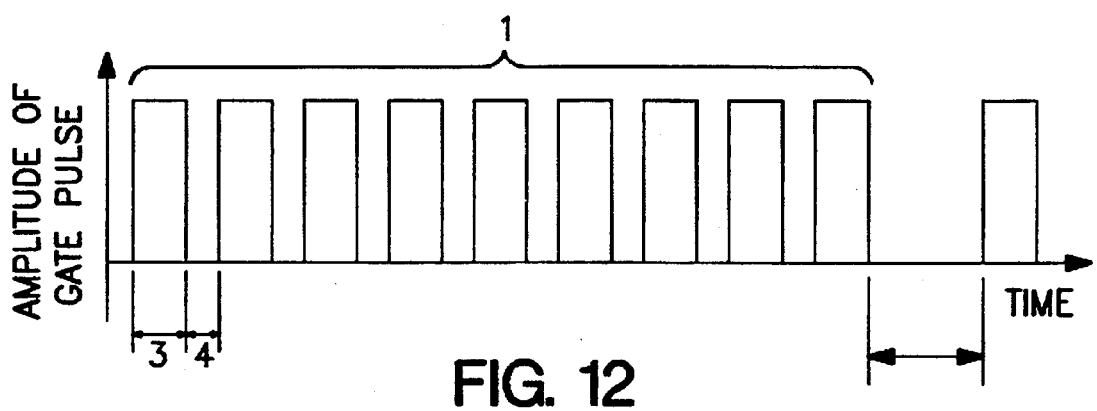
FIG. 12 is a diagram illustrative of a wave form of a gate pulse in a discontinuous high frequency discharge in a first embodiment according to the present invention.

The deposition of the amorphous silicon film is carried out under the following conditions. A flow rate of silane is 200 sccm. A flow rate of hydrogen is 600 sccm. A gas pressure is 200 Pa. A substrate temperature is 300° C. A wave form of the gate pulse for controlling the high frequency power is illustrated in FIG. 12. A high duty ratio pulse sequence 1 comprises nine pulses in which on-time is 800 microseconds and off time is 200 microseconds. The duty ratio is 80%. A low duty pulse sequence inserted into the gate pulse is zero duty pulse. The gate pulse sequence comprises alternative 80% duty ratio pulse of nine pulses and zero duty ratio.

An evaluation of the powder particle is carried out by use of a particle detector utilizing scattering of laser beam to detect particles adhered on a substrate. Measurement of the number of particles adhered on the substrate before and after the deposition processes was made.

In the gate pulse on-state, a high frequency power of 400 W is applied so that a deposition rate is 810 angstroms per minute. For comparison, the constant duty ratio discontinuous plasma discharge is carried out at the duty ratio of 80% to deposit an amorphous silicon film. In this case, the deposition rate is 900 angstroms per minute. The deposited amorphous silicon film has a large number of particles in an area of 240 mm×290 mm, for example, 2400 particles having diameters not less than 2 micrometers. By contrast, in the present invention, measured particles are 56 only. This indicates that the present invention may provide a considerable reduction of the number of the particles.

A second embodiment according to the present invention will be described in detail in which a chemical vapor deposition system for depositing an amorphous silicon film has the same structure as that of the first embodiment.

Figure 13:
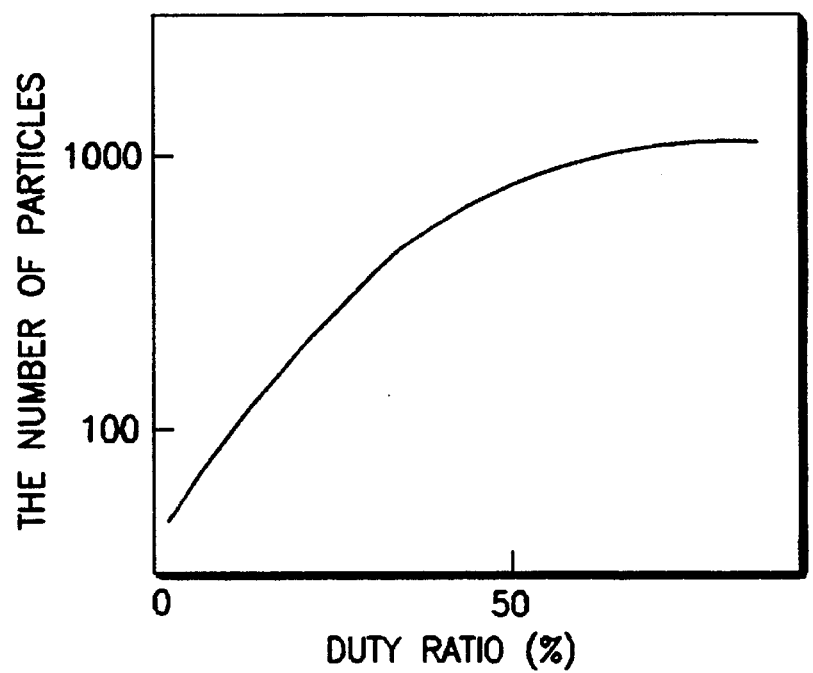
FIG. 13 is a diagram illustrative of the number of powder particles versus a duty ratio of tenth gate pulse in a second embodiment according to the present invention.

The deposition of the amorphous silicon film is carried out under the following conditions. A flow rate of silane is 200 sccm. A gas pressure is 140 Pa. A substrate temperature is 300° C. A cyclic frequency of the gate pulse is 500 Hz. A high frequency discharge power is 500 W. The duty ratio is 70% in the range of from first to ninth pulse. In the tenth gate pulse, the duty ratio is reduced down to 0%. At this time, the generation of the powder particles was measured. Prior to the reduction of the duty ratio or in the duty ratio of 70%, the deposition rate of the amorphous silicon is 950 angstroms per minute. After the reduction of the duty ratio or in the duty ratio of 0%, the deposition rate is 855 angstroms per minute. FIG. 13 illustrates the number of powder particles with diameters not more than 2 micrometers in an area of 240 mm×290 mm versus the duty ratio in the tenth gate pulse in which the duty ratio is reduced as described above. From FIG. 13, it could be understood that when the duty ratio of the tenth gate pulse is not more than 50%, the number of the powder particles is rapidly reduced. This reduction is caused by insertion of the low duty ratio pulse. When the duty ratio of the tenth pulse, the particles is considerably reduced by one order as compared to that when the duty ratio is 70%.

A third embodiment according to the present invention will be described in detail in which a commercially available plasma chemical vapor deposition system is used to deposit hydrogenated amorphous silicon film in which an accommodated high frequency discharge power is taken off from the system, and therefor a different discharge power source of on oscillation of 13.56 MHz whose on-off switching operation is controllable by gate pulse is provided to the system. Also, an automatic impedance adjuster with for high speed adjusting of radio frequency and a gate pulse generator for generating the gate pulse are provided to the deposition system. The pulse generator is electrically connected to the high frequency power source. The deposition was carried out under the conditions as follows. A flow rate of silane is 200 sccm. A flow rate of hydrogen is 800 sccm. A gas pressure is 250 Pa. A substrate temperature is 300° C. A cyclic frequency is 1923 Hz for the high frequency discharge. The duty ratio is 29%. A power density for the discharge is approximately 0.12 W/cm$^2$. The above deposition results in a reduction of the number of the powder particles. The deposited amorphous silicon film has a high electron mobility.

Further, the deposition processes may be carried out under the following conditions. A flow rate of silane is 200 sccm. A flow rate of hydrogen is 800 sccm. A gas pressure is 250 Pa. A substrate temperature is 300° C. A cyclic frequency is 1111 Hz for the high frequency discharge. The duty ratio is 17%. A power density for the discharge is approximately 0.12 W/cm$^2$. The above deposition results in a reduction of the number of the powder particles. The deposited amorphous silicon film has a high electron mobility.

Furthermore, the deposition processes may be carried out under the following conditions. A flow rate of silane is 200 sccm. A flow rate of hydrogen is 800 sccm. A gas pressure is 250 Pa. A substrate temperature is 300° C. A cyclic frequency is 870 Hz for the high frequency discharge. The duty ratio is 13%. A power density for the discharge is approximately 0.12 W/cm$^2$. The above deposition results in a reduction of the number of the powder particles. The deposited amorphous silicon film has a high electron mobility.

A fourth embodiment according to the present invention will be described in detail in which the above described novel deposition method is applicable to the fabrication of the thin film transistor involving an amorphous silicon film. The fabrication processes will be described.

Figure 14A:
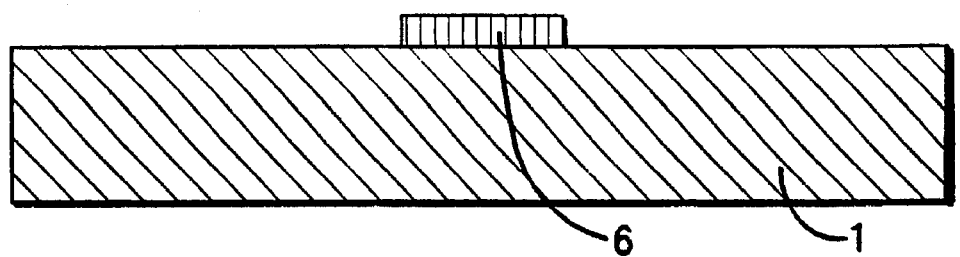

As shown in FIG. 14A, a glass substrate 1 made of low alkali glass is prepared for subsequent formation of a chrome film by spattering on the substrate. The chrome film is patterned by use of photoresist pattern to form a gate electrode 6.

Figure 14B:
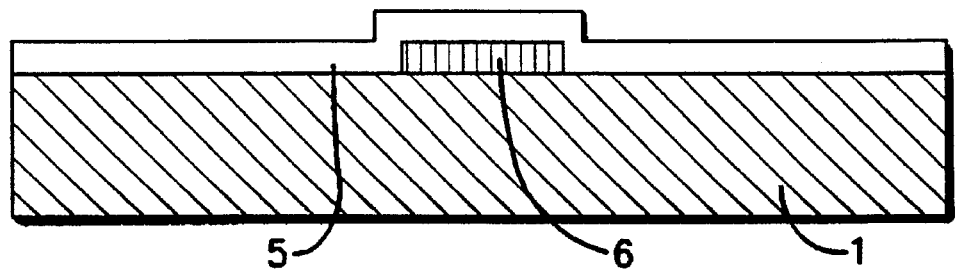

As shown in FIG. 14B, a gate insulating film 5 made of silicon nitride is deposited on the gate electrode 6 and an exposed surface of the substrate 1 by use of a normal chemical vapor deposition.

Figure 14C:
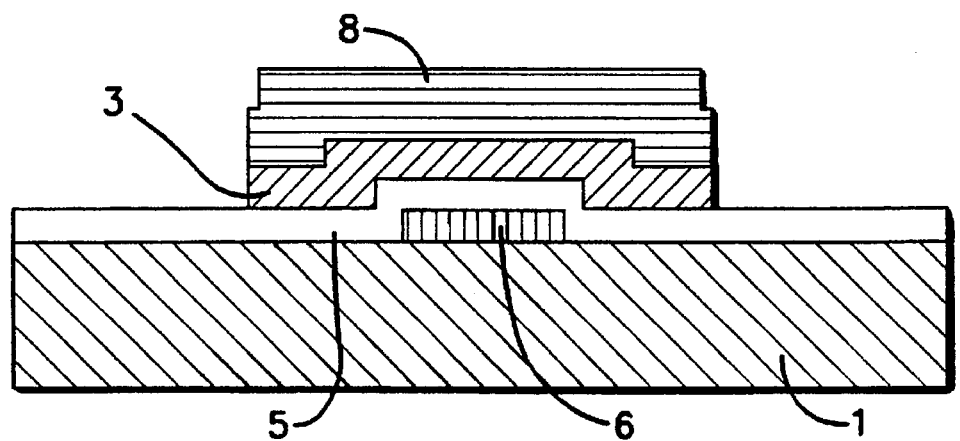

As shown in FIG. 14C, A hydrogen amorphous silicon film 3 is deposited on the gate insulating film 5 by use of the novel discontinuous plasma discharge chemical vapor deposition method. The deposition was made under the following conditions. A flow rate of silane is 200 sccm. A flow rate of hydrogen is 800 sccm. A gas pressure is 250 Pa. A substrate temperature is 300° C. A cyclic frequency is 1111 Hz for the high frequency discharge. The duty ratio is 17%. A power density for the discharge is approximately 0.12 W/cm$^2$. A passivation insulating film 8 made of silicon nitride is further deposited on the hydrogenated amorphous silicon film 3 by use of the normal chemical vapor deposition method. A normal photo resist etching process is carried out to define a thin film transistor as shown in FIG. 14C. A further photo resist etching process is carried out to define the passivation insulating film 8 to expose the hydrogenated amorphous silicon film 3 in source and drain regions.

Figure 14D:
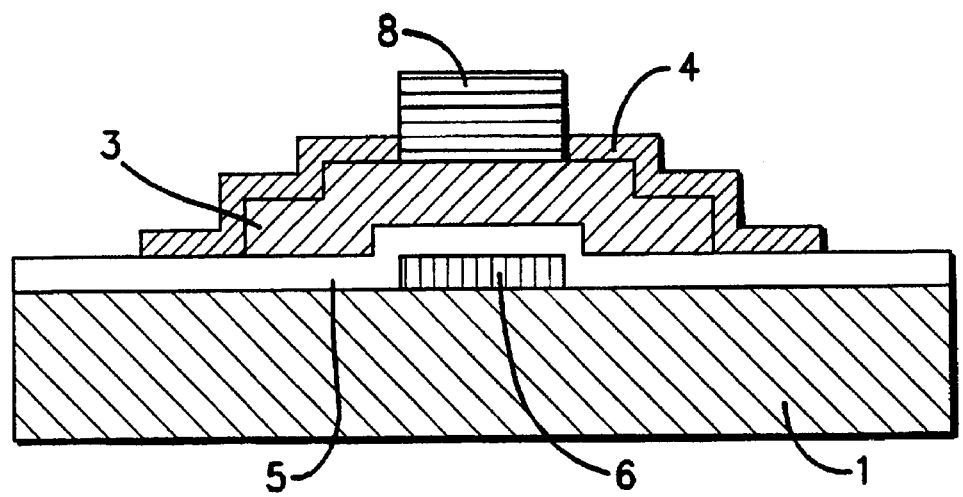

As shown in FIG. 14D, an n$^+$-type hydrogenated amorphous silicon film 4 is deposited on the exposed surface of the passivation insulating film 3 by use of the normal plasma chemical vapor deposition process.

Figure 14E:
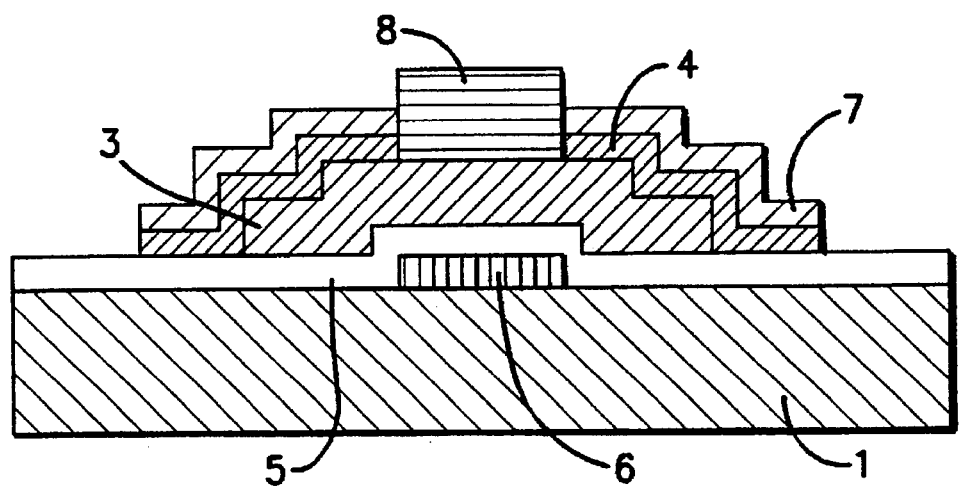

As shown in FIG. 14E, a source and drain wiring layer 7 comprising chrome films is deposited for subsequent photo resist etching processes thereby a channel protection inverse staggered thin film transistor is fabricated.

A fifth embodiment according to the present invention will be described in which a novel fabrication method for a thin film transistor is provided.

Figure 15A:
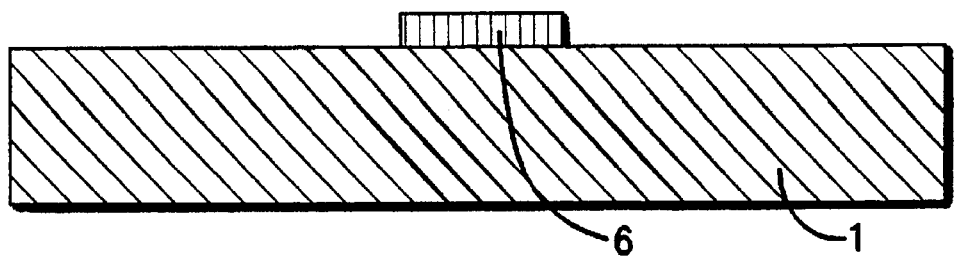

As shown in FIG. 15A, a glass substrate 1 made of low alkali glass is prepared for subsequent formation of a chrome film by spattering on the substrate. The chrome film is patterned by use of photoresist pattern to form a gate electrode 6.

Figure 15B:
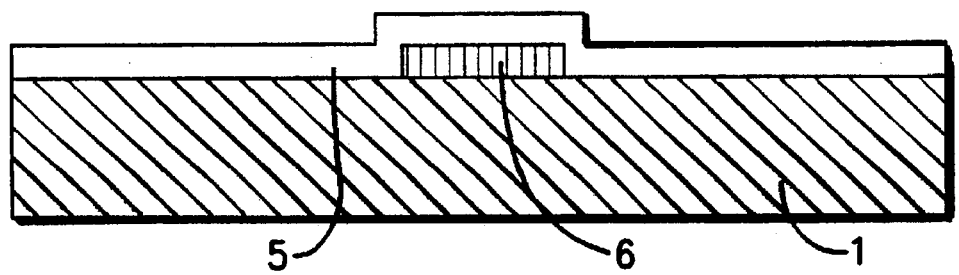

As shown in FIG. 15B, a gate insulating film 5 made of silicon nitride is deposited on the gate electrode 6 and an exposed surface of the substrate 1 by use of a normal chemical vapor deposition.

Figure 15C:
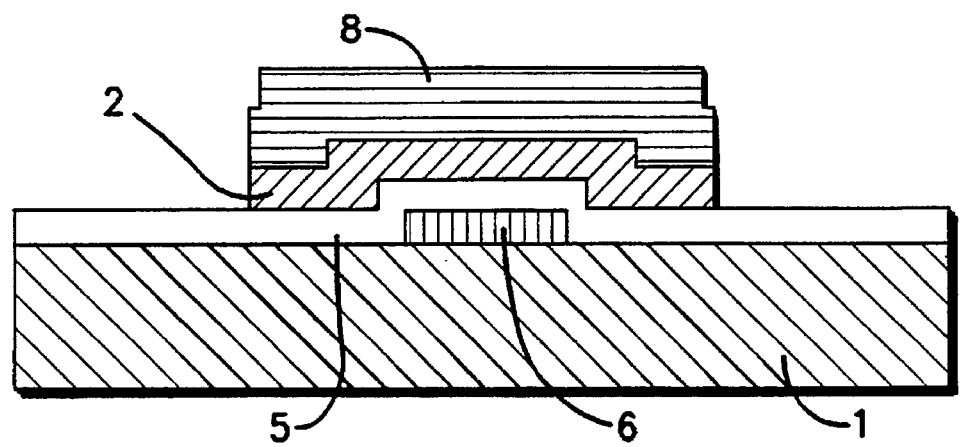

As shown in FIG. 15C, a hydrogen amorphous silicon film 2 is deposited on the gate insulating film 5 by use of the normal plasma discharge chemical vapor deposition method. A passivation insulating film 8 made of silicon nitride is further deposited on the hydrogenated amorphous silicon film 3 by use of the normal chemical vapor deposition method. A normal photo resist etching process is carried out to define a thin film transistor as shown in FIG. 15C. A further photo resist etching process is carried out to define the passivation insulating film 8 to expose the hydrogenated amorphous silicon film 3 in source and drain regions.

Figure 15D:
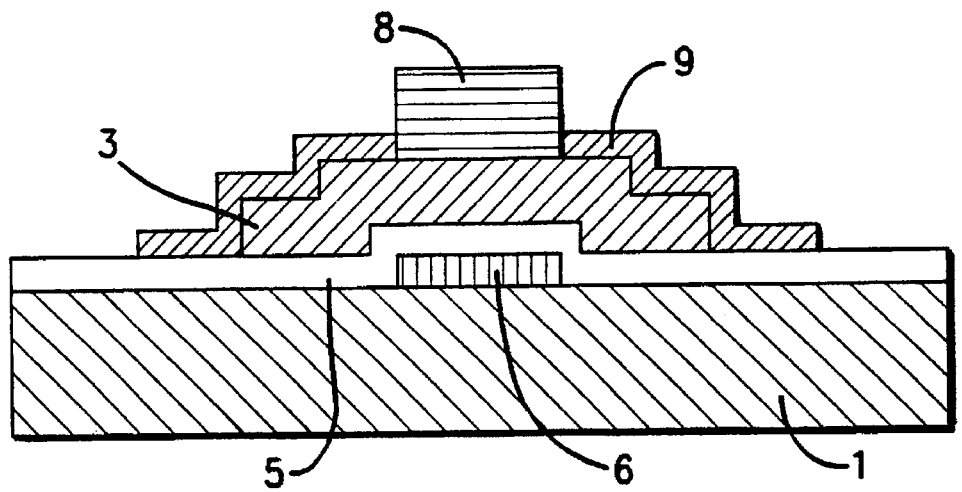
Figure 15E:
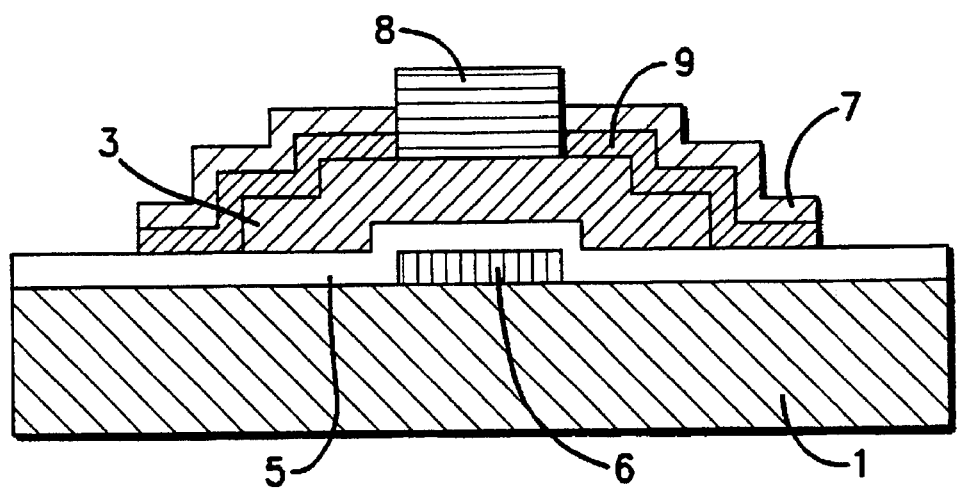

As shown in FIG. 15D, an n$^+$-type hydrogenated amorphous silicon film 9 is deposited on the exposed surface of the passivation insulating film 3 by use of a novel discontinuous plasma chemical vapor deposition process. The deposition was made under the following conditions. A flow rate of silane is 25 sccm. A flow rate of phosphorus is 160 sccm in which a concentration is 0.5% with dilution of hydrogen. A gas pressure is 250 Pa. A substrate temperature is 300° C. A cyclic frequency is 1923 Hz for the high frequency discharge. The duty ratio is 29%. A power density for the discharge is approximately 0.12 W/cm$^2$.

As shown in FIG. 15B, a source and drain wiring layer 7 comprising chrome films is deposited for subsequent photo resist etching processes thereby a channel protection inverse staggered thin film transistor is fabricated.

Although in the above embodiments silane is used as a source gas, disilane is available in which the obtained amorphous silicon has the same high quality as that when using the silane gas. On the other hand, when disilane is used, a further high deposition rate and a further reduced powder are obtained. Trisilane is also available.

Figure 16:
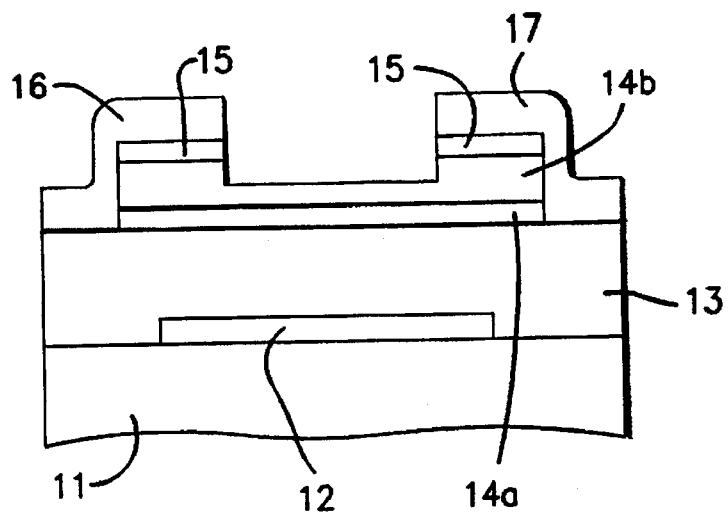
FIG. 16 is a fragmentary cross sectional elevation view illustrative of a thin film transistor involving amorphous silicon films fabricated by a novel fabrication method in a sixth embodiment according to the present invention.

A sixth embodiment according to the present invention will be described in which a novel fabrication method for a thin film transistor is provided. A structure of the thin film transistor is illustrated in FIG. 16. The thin film transistor has an insulating substrate 11 comprising a glass substrate. A gate electrode 12 made of chrome having a thickness of approximately 100 is formed on the glass substrate 11. A gate insulating film 13 having a thickness of 400 nanometers is formed to cover the gate electrode. Double layer structure comprising bottom and top amorphous silicon films 14a and 14b are formed on the gate insulating film 13. The bottom amorphous silicon film 14a has a high electron mobility, while the top amorphous silicon film 14b has a low electron mobility. The bottom high electron mobility amorphous silicon film 14a has a thickness of 20 nanometers which is deposited by use of the continuous plasma discharge process at a low discharge power and a low deposition rate, while the top electron mobility amorphous silicon film 14b has a thickness of 300 nanometers which is deposited by use of a discontinuous plasma discharge process at a high discharge power and a high deposition rate. The top electron mobility amorphous silicon film 14b has a recessed portion surrounded by a projecting portion. An n-doped layer 15 is formed on the projecting portion of the top amorphous silicon film 14b to form an ohmic contact therewith. Source and drain electrodes are formed on the doped layer 15 and its peripheral regions.

Fabrication processes for the thin film transistor will be described in detail. The insulating substrate 11 is washed for spattering to form the chrome film having a thickness of 100 nanometers and subsequent patterning by use of photolithography to form the gate electrode 12. A normal plasma chemical vapor deposition process is carried out to form the gate insulating film 13 covering the gate electrode 12 made of silicon nitride having a thickness of 400 nanometers.

The normal continuous high frequency discharge chemical vapor deposition is carried out for four minutes to deposit the bottom high electron mobility amorphous silicon film 14a in which waveforms of the continuous discharge is illustrated in FIG. 6. The conditions for the deposition are as follows. A flow rate of silane as a source gas is 150 sccm. A gas pressure is 60 Pa. A substrate temperature is 300° C. A high frequency discharge power is 40 W. The deposition rate of the amorphous silicon is 5 nanometers per minute. The novel discontinuous high frequency discharge chemical vapor deposition is carried out for six minutes and forty seconds to deposit the top electron mobility amorphous silicon film 14b in which waveforms of the discontinuous discharge is illustrated in FIG. 7. The conditions for the deposition are as follows. A flow rate of silane is 200 sccm. A flow rate of hydrogen is 600 sccm. A gas pressure is 200 Pa. A substrate temperature is 300° C. A high frequency discharge power is 600 W. A cyclic frequency is 1 kHz. The duty ratio is 40% in which discharge on-time is 400 microseconds, while discharge off-time is 600 microseconds. The deposition rate of the amorphous silicon is 45 nanometers per minute. The obtained top amorphous silicon 14b has a thickness of 300 nanometers. A plasma chemical vapor deposition method is carried out by use of a silane gas including 1% phosphorus gas to deposit the n-doped layer 15 having the thickness of 40 nanometers. A photolithography is carried out to etch the amorphous silicon film and the doped layer to form a recessed portion therein. A chromium film having a thickness of 150 nanometers is formed for patterning to form source and drain electrodes 16 and 17. A dry etching is carried out to remove a part of the n-doped layer 15 between the source and drain electrodes 16 and 17 for separation of the source and drain electrodes 16 and 17 thereby the thin film transistor is fabricated.

The obtained thin film transistor shows an electron mobility of 1.0 $cm^2/Vs$ and a threshold voltage of 1.5 V. Total time consumed for depositing all amorphous silicon films is ten minutes and forty seconds.

Figure 19:
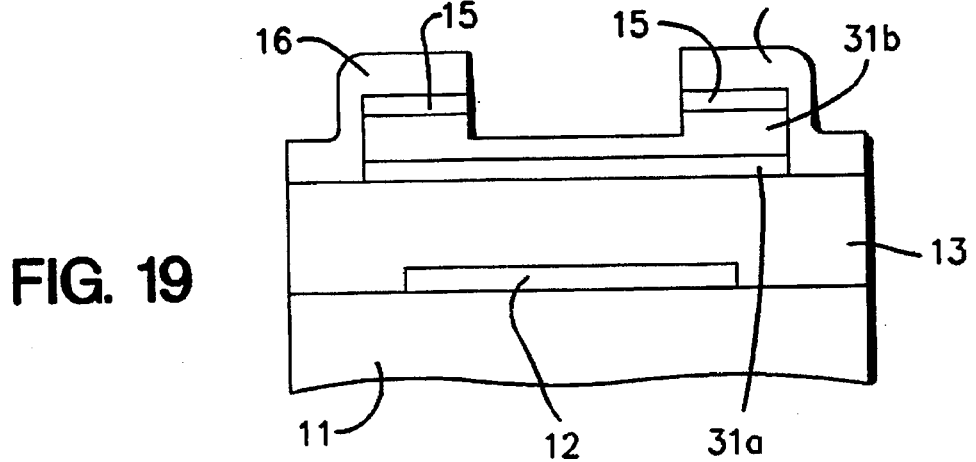
FIG. 19 is a fragmentary cross sectional elevation view illustrative of a thin film transistor involving amorphous silicon films fabricated by a novel fabrication method in seventh and eighth embodiments according to the present invention.

A seventh embodiment according to the present invention will be described in which a novel fabrication method for a thin film transistor is provided. A structure of the thin film transistor is illustrated in FIG. 19. The thin film transistor has an insulating substrate 11 comprising a glass substrate. A gate electrode 12 made of chrome having a thickness of approximately 100 is formed on the glass substrate 11. A gate insulating film 13 having a thickness of 400 nanometers is formed to cover the gate electrode. Double layer structure comprising bottom and top amorphous silicon films 31a and 31b are formed on the gate insulating film 13. The bottom amorphous silicon film 31a has a high electron mobility, while the top amorphous silicon film 31b has a low electron mobility. The bottom high electron mobility amorphous silicon film 31a has a thickness of 20 nanometers which is deposited by use of the novel low duty ratio discontinuous plasma discharge process, while the top electron mobility amorphous silicon film 31b has a thickness of 300 nanometers which is deposited by use of the novel discontinuous plasma discharge process at a high duty ratio. The top electron mobility amorphous silicon film 31b has a recessed portion surrounded by a projecting portion. An n-doped layer 15 is formed on the projecting portion of the top amorphous silicon film 31b to form an ohmic contact therewith. Source and drain electrodes are formed on the doped layer 15 and its peripheral regions.

Fabrication processes for the thin film transistor will be described in detail. The insulating substrate 11 is washed for spattering to form the chrome film having a thickness of 100 nanometers and subsequent patterning by use of photolithography to form the gate electrode 12. A normal plasma chemical vapor deposition process is carried out to form the gate insulating film 13 covering the gate electrode 12 made of silicon nitride having a thickness of 400 nanometers.

Figure 17:
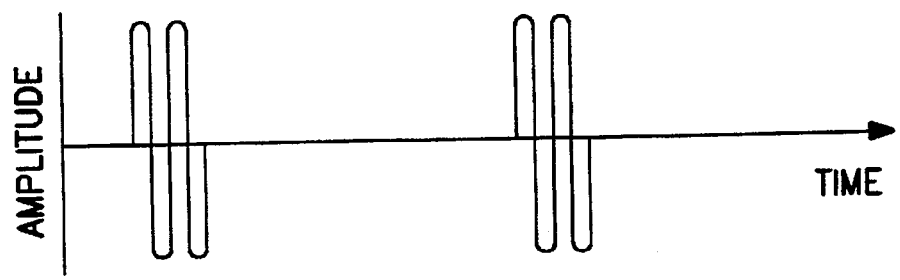
FIG. 17 is a diagram illustrative of a wave form of a discontinuous high frequency discharge power at a low duty ratio in seventh and eighth embodiments according to the present invention.
Figure 18:
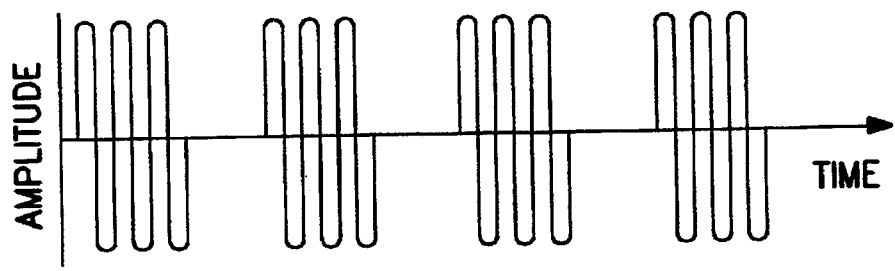
FIG. 18 is a diagram illustrative of a wave form of a discontinuous high frequency discharge power at a high duty ratio in seventh and eighth embodiments according to the present invention.

The discontinuous high frequency discharge chemical vapor deposition is carried out for three minutes to deposit the bottom high electron mobility amorphous silicon film 31a in which waveforms of the discontinuous discharge is illustrated in FIG. 17. The conditions for the deposition are as follows. Flow rates of silane and hydrogen are 150 sccm and 600 sccm. A gas pressure is 200 Pa. A substrate temperature is 300° C. A high frequency discharge power is 600 W. A cyclic frequency is 500 Hz. The duty ratio is 5% in which discharge on-time is 100 microseconds, while discharge off-time is 1900 microseconds. The deposition rate of the amorphous silicon is 7 nanometers per minute. Subsequently, the novel discontinuous high frequency discharge chemical vapor deposition is carried out for six minutes and forty seconds to deposit the top electron mobility amorphous silicon film 31b in which waveforms of the discontinuous discharge is illustrated in FIG. 18. The conditions for the deposition are as follows. A flow rate of silane is 200 sccm. A flow rate of hydrogen is 600 sccm. A gas pressure is 200 Pa. A substrate temperature is 300° C. A high frequency discharge power is 600 W. A cyclic frequency is 1 kHz. The duty ratio is 40% in which discharge on-time is 400 microseconds, while discharge off-time is 600 microseconds. The deposition rate of the amorphous silicon is 45 nanometers per minute. The obtained top amorphous silicon 31b has a thickness of 300 nanometers. The total time consumed for the deposition of the to and bottom amorphous silicon films is nine minutes and forty seconds, which is shorter by four minutes and twenty seconds than that when the continuous discharge processes are carried out. According to this embodiment, the deposition processes may be carried out without any discontinuity which reduces the necessary time for fabricating the thin film transistor. A chromium film having a thickness of 150 nanometers is formed for patterning to form source and drain electrodes 16 and 17. A dry etching is carried out to remove a part of the n-doped layer 15 between the source and drain electrodes 16 and 17 for separation of the source and drain electrodes 16 and 17 thereby the thin film transistor is fabricated.

In this embodiment, the duty ratio is discontinuously varied from 5% to 40%. The obtained thin film transistor shows an electron mobility of 1.1 cm$^2$/Vs and a threshold voltage of 1.5 V. Total time consumed for depositing all amorphous silicon films is nine minutes and forty seconds.

An eighth embodiment according to the present invention will be described in which a novel fabrication method for a thin film transistor is provided. The thin film transistor has an insulating substrate 11 comprising a glass substrate. A gate electrode 12 made of chrome having a thickness of approximately 100 is formed on the glass substrate 11. A gate insulating film 13 having a thickness of 400 nanometers is formed to cover the gate electrode. Double layer structure comprising bottom and top amorphous silicon films 31a and 31b are formed on the gate insulating film 13. The bottom amorphous silicon film 31a has a high electron mobility, while the top amorphous silicon film 31b has a low electron mobility. The bottom high electron mobility amorphous silicon film 31a has a thickness of 20 nanometers which is deposited by use of the discontinuous plasma discharge process at a low duty ratio, while the top electron mobility amorphous silicon film 31b has a thickness of 300 nanometers which is deposited by use of the discontinuous plasma discharge process at a high duty ratio. The top electron mobility amorphous silicon film 31b has a recessed portion surrounded by a projecting portion. An n-doped layer 15 is formed on the projecting portion of the top amorphous silicon film 31b to form an ohmic contact therewith. Source and drain electrodes are formed on the doped layer 15 and its peripheral regions.

Fabrication processes for the thin film transistor will be described in detail. The insulating substrate 11 is washed for spattering to form the chrome film having a thickness of 100 nanometers and subsequent patterning by use of photolithography to form the gate electrode 12. A normal plasma chemical vapor deposition process is carried out to form the gate insulating film 13 covering the gate electrode 12 made of silicon nitride having a thickness of 400 nanometers.

The discontinuous high frequency discharge chemical vapor deposition is carried out for one minute to deposit the bottom high electron mobility amorphous silicon film 31a in which waveforms of the discontinuous discharge is illustrated in FIG. 17. The conditions for the deposition are as follows. Flow rates of silane and hydrogen are 200 sccm and 600 sccm. A gas pressure is 200 Pa. A substrate temperature is 300° C. A high frequency discharge power is 600 W. A cyclic frequency is 500 Hz. The duty ratio is 5%. Subsequently, the duty ratio and the cyclic frequency are linearly changed into 40% and 1000 Hz for two minutes. The discharge wave form after change is illustrated in FIG. 18. Under the condition of the discharge power of 600, the deposition process is continued for six minutes. The total deposition time is 9 minutes.

In this embodiment, the duty ratio is continuously and linearly varied from 5% to 40%. The obtained thin film transistor shows an electron mobility of 1.1 cm$^2$/Vs and a threshold voltage of 1.5 V. Total time consumed for depositing all amorphous silicon films is nine minutes and forty seconds.

Figure 22:
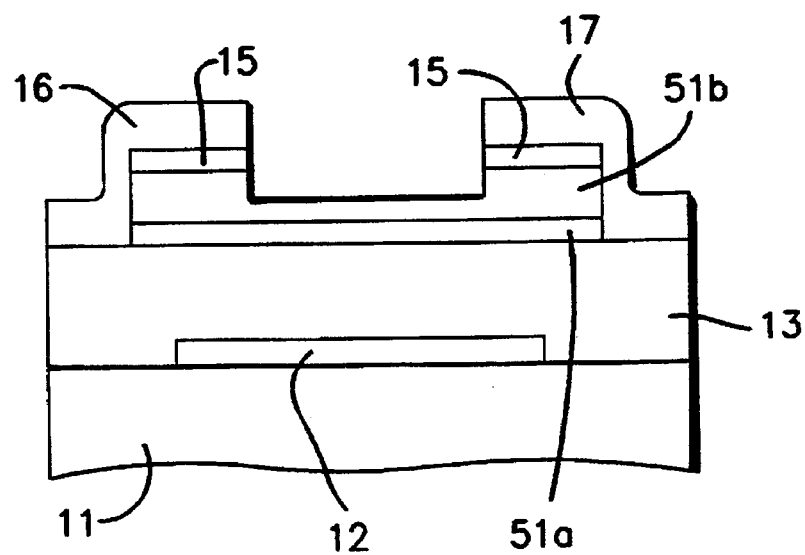
FIG. 22 is a fragmentary cross sectional elevation view illustrative of a thin film transistor involving amorphous silicon films fabricated by a novel fabrication method in ninth and tenth embodiments according to the present invention.

A ninth embodiment according to the present invention will be described in which a novel fabrication method for a thin film transistor is provided. A structure of the thin film transistor is illustrated in FIG. 22. The thin film transistor has an insulating substrate 11 comprising a glass substrate. A gate electrode 12 made of chrome having a thickness of approximately 100 nanometers is formed on the glass substrate 11. A gate insulating film 13 having a thickness of 400 nanometers is formed to cover the gate electrode. Double layer structure comprising bottom and top amorphous silicon films 51a and 51b are formed on the gate insulating film 13. The bottom amorphous silicon film 51a has a high electron mobility, while the top amorphous silicon film 51b has a low electron mobility. The bottom high electron mobility amorphous silicon film 51a has a thickness of 20 nanometers which is deposited by use of the discontinuous plasma discharge process at a low discharge power, while the top electron mobility amorphous silicon film 51b has a thickness of 300 nanometers which is deposited by use of the discontinuous plasma discharge process at a high discharge power. The top low electron mobility amorphous silicon film 51b has a recessed portion surrounded by a projecting portion. An n-doped layer 15 is formed on the projecting portion of the top amorphous silicon film 51b to form an ohmic contact therewith. Source and drain electrodes are formed on the doped layer 15 and its peripheral regions.

Fabrication processes for the thin film transistor will be described in detail. The insulating substrate 11 is washed for spattering to form the chrome film having a thickness of 100 nanometers and subsequent patterning by use of photolithography to form the gate electrode 12. A normal plasma chemical vapor deposition process is carried out to form the gate insulating film 13 covering the gate electrode 12 made of silicon nitride having a thickness of 400 nanometers.

Figure 20:
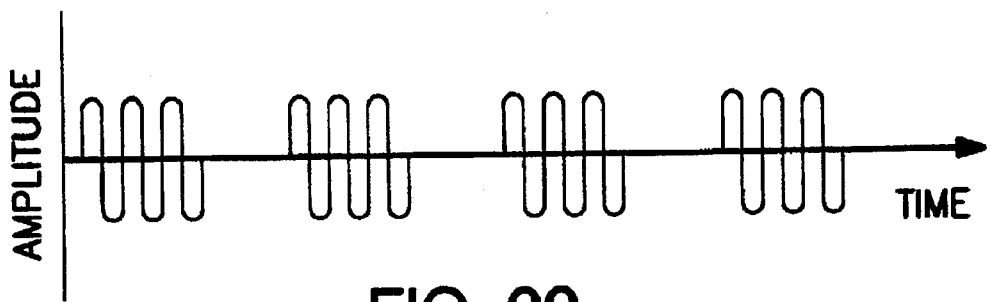
FIG. 20 is a diagram illustrative of a wave form of a discontinuous high frequency discharge power at a low duty ratio in ninth and tenth embodiments according to the present invention.
Figure 21:
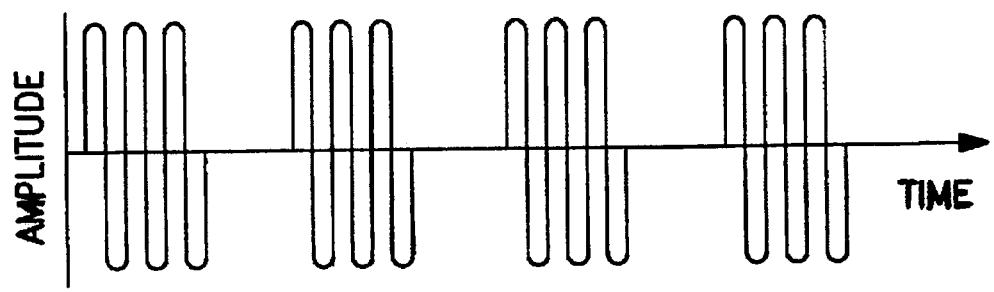
FIG. 21 is a diagram illustrative of a wave form of a discontinuous high frequency discharge power at a high duty ratio in ninth and tenth embodiments according to the present invention.

The discontinuous high frequency discharge chemical vapor deposition is carried out for three minutes to deposit the bottom high electron mobility amorphous silicon film 51a in which waveforms of the discontinuous discharge is illustrated in FIG. 20. The conditions for the deposition are as follows. Flow rates of silane and hydrogen are 200 sccm and 600 sccm. A gas pressure is 200 Pa. A substrate temperature is 300° C. A high frequency discharge power is 100 W. A cyclic frequency is 1000 Hz. The duty ratio is 40% in which discharge on-time is 400 microseconds, while discharge off-time is 600 microseconds. The deposition rate of the amorphous silicon is 7 nanometers per minute. Subsequently, the discharge power is discontinuously changed into 600 W, while the duty ratio and the cyclic frequency are not changed. The novel discontinuous high frequency discharge chemical vapor deposition is carried out for six minutes and forty seconds to deposit the top low electron mobility amorphous silicon film 51b in which waveforms of the discontinuous discharge is illustrated in FIG. 21. The deposition rate is 45 nanometers per minute. The obtained top amorphous silicon 51b has a thickness of 300 nanometers. The total time consumed for the deposition of the to and bottom amorphous silicon films is nine minutes and forty seconds, which is shorter by four minutes and twenty seconds than that when the continuous discharge processes are carried out. According to this embodiment, the deposition processes may be carried out without any discontinuity which reduces the necessary time for fabricating the thin film transistor. A chromium film having a thickness of 150 nanometers is formed for patterning to form source and drain electrodes 16 and 17. A dry etching is carried out to remove a part of the n-doped layer 15 between the source and drain electrodes 16 and 17 for separation of the source and drain electrodes 16 and 17 thereby the thin film transistor is fabricated.

In this embodiment, the discharge power is changed from 100 W to 600 W. The obtained thin film transistor shows an electron mobility of 1.1 cm$^2$/Vs and a threshold voltage of 1.5 V. Total time consumed for depositing all amorphous silicon films are nine minutes and forty seconds.

A tenth embodiment according to the present invention will be described in which a novel fabrication method for a thin film transistor is provided. A structure of the thin film transistor is the same as that of the ninth embodiment as illustrated in FIG. 22. The thin film transistor has an insulating substrate 11 comprising a glass substrate. A gate electrode 12 made of chrome having a thickness of approximately 100 is formed on the glass substrate 11. A gate insulating film 13 having a thickness of 400 nanometers is formed to cover the gate electrode. Double layer structure comprising bottom and top amorphous silicon films 51a and 51b are formed on the gate insulating film 13. The bottom amorphous silicon film 51a has a high electron mobility, while the top low amorphous silicon film 51b has a low electron mobility. The bottom high electron mobility amorphous silicon film 51a has a thickness of 20 nanometers which is deposited by use of the discontinuous plasma discharge process at a low discharge power, while the top electron mobility amorphous silicon film 51b has a thickness of 300 nanometers which is deposited by use of the discontinuous plasma discharge process at a high discharge power. The top low electron mobility amorphous silicon film 51b has a recessed portion surrounded by a projecting portion. An n-doped layer 15 is formed on the projecting portion of the top amorphous silicon film 51b to form an ohmic contact therewith. Source and drain electrodes are formed on the doped layer 15 and its peripheral regions.

Fabrication processes for the thin film transistor will be described in detail. The insulating substrate 11 is washed for spattering to form the chrome film having a thickness of 100 nanometers and subsequent patterning by use of photolithography to form the gate electrode 12. A normal plasma chemical vapor deposition process is carried out to form the gate insulating film 13 covering the gate electrode 12 made of silicon nitride having a thickness of 400 nanometers.

The discontinuous high frequency discharge chemical vapor deposition is carried out for one minute to deposit the bottom high electron mobility amorphous silicon film 51a in which waveforms of the discontinuous discharge is illustrated in FIG. 20. The conditions for the deposition are as follows. Flow rates of silane and hydrogen are 200 sccm and 600 sccm. A gas pressure is 200 Pa. A substrate temperature is 300° C. A high frequency discharge power is 100 W. A cyclic frequency is 1000 Hz. The duty ratio is 40% in which discharge on-time is 400 microseconds, while discharge off-time is 600 microseconds. The deposition rate of the amorphous silicon is 7 nanometers per minute. Subsequently, the discharge power is continuously and linearly changed from 100 W into 600 W for two minutes, while the duty ratio and the cyclic frequency are not changed. The novel discontinuous high frequency discharge chemical vapor deposition is carried out for six minutes to deposit the top low electron mobility amorphous silicon film 51b in which waveforms of the discontinuous discharge is illustrated in FIG. 21. The obtained top amorphous silicon 51b has a thickness of 300 nanometers. The total time consumed for the deposition of the top and bottom amorphous silicon films is nine minutes. According to this embodiment, the deposition processes may be carried out without any discontinuity which reduces the necessary time for fabricating the thin film transistor.

In this embodiment, the discharge power is linearly changed from 100 W to 600 W. The obtained thin film transistor shows an electron mobility of 1.1 cm$^2$/Vs and a threshold voltage of 1.5 V.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the sprit and scope of the invention.

What is claimed is:

1. A method of depositing an amorphous silicon film wherein a discontinuous discharge process having a cyclic frequency of at least 500 Hz and comprising alternate high duty ratio periods and low duty ratio periods is carried out to decompose a silane system gas for a chemical vapor deposition for depositing an amorphous silicon film.

2. The method as claimed in claim 1, wherein said silane system gas is silane.

3. The method as claimed in claim 1, wherein said silane system gas is disilane.

4. The method as claimed in claim 1, wherein said silane system gas is trisilane.

5. The method as claimed in claim 1, wherein the duty ratio is discontinuously varied between high and low states.

6. The method as claimed in claim 1, wherein the duty ratio is continuously and linearly varied between high and low states.

7. The method as claimed in claim 1, wherein the low duty ratio includes a zero duty ratio.

* * * * *